(12) United States Patent
Kim et al.

(10) Patent No.: US 9,263,470 B1
(45) Date of Patent: Feb. 16, 2016

(54) SEMICONDUCTOR DEVICE, MANUFACTURING METHOD THEREOF, AND DISPLAY APPARATUS

(71) Applicant: SAMSUNG DISPLAY CO., LTD., Yongin, Gyeonggi-Do (KR)

(72) Inventors: Dongjo Kim, Yongin (KR); Myounggeun Cha, Yongin (KR); Yoonho Khang, Yongin (KR); Soyoung Koo, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/585,525

(22) Filed: Dec. 30, 2014

(30) Foreign Application Priority Data

Aug. 4, 2014 (KR) .................. 10-2014-0099976

(51) Int. Cl.
| | |
|---|---|
| *H01L 21/00* | (2006.01) |
| *H01L 27/12* | (2006.01) |
| *H01L 29/786* | (2006.01) |
| *H01L 21/02* | (2006.01) |
| *H01L 27/32* | (2006.01) |

(52) U.S. Cl.
CPC ........ *H01L 27/1218* (2013.01); *H01L 21/0217* (2013.01); *H01L 21/02164* (2013.01); *H01L 21/02422* (2013.01); *H01L 21/02532* (2013.01); *H01L 21/02592* (2013.01); *H01L 21/02678* (2013.01); *H01L 27/1222* (2013.01); *H01L 27/3258* (2013.01); *H01L 29/78603* (2013.01); *H01L 29/78654* (2013.01); *H01L 29/78675* (2013.01)

(58) Field of Classification Search
USPC .......................................... 438/487, 486, 166
See application file for complete search history.

(56) References Cited

U.S. PATENT DOCUMENTS

| | | | |
|---|---|---|---|
| 2002/0017685 A1 | 2/2002 | Kasahara et al. | |
| 2007/0290200 A1 | 12/2007 | Asano | |
| 2011/0169720 A1 | 7/2011 | Hwang et al. | |
| 2012/0049206 A1 | 3/2012 | Choi et al. | |
| 2012/0313098 A1* | 12/2012 | Kim et al. ............ | 257/59 |

FOREIGN PATENT DOCUMENTS

| | | |
|---|---|---|
| JP | 2007-324425 A | 12/2007 |
| JP | 2008-141046 A | 6/2008 |
| KR | 10-2001-0038176 A | 5/2001 |
| KR | 10-2008-0043417 A | 5/2008 |
| KR | 10-2011-0081629 A | 7/2011 |
| KR | 10-2012-0019025 A | 3/2012 |

* cited by examiner

*Primary Examiner* — Reema Patel
(74) *Attorney, Agent, or Firm* — Lee & Morse, P.C.

(57) ABSTRACT

Provided is a semiconductor device including a buffer layer that is on a substrate and includes an inclined surface; a crystalline silicon layer that is on the buffer layer; a gate electrode that is on the crystalline silicon layer while being insulated from the crystalline silicon layer; and a source electrode and a drain electrode that are each electrically connected to the crystalline silicon layer, the angle between the substrate and the inclined surface being in a range of about 17.5 degrees to less than about 70 degrees.

17 Claims, 5 Drawing Sheets

US 9,263,470 B1

SEMICONDUCTOR DEVICE, MANUFACTURING METHOD THEREOF, AND DISPLAY APPARATUS

CROSS-REFERENCE TO RELATED APPLICATION

Korean Patent Application No. 10-2014-0099976, filed on Aug. 4, 2014, in the Korean Intellectual Property Office, and entitled: "Semiconductor Device, Manufacturing Method Thereof, and Display Apparatus," is incorporated by reference herein in its entirety.

BACKGROUND

1. Field

One or more embodiments relate to a semiconductor device, a manufacturing method thereof, and a display apparatus.

2. Description of the Related Art

A display apparatus such as an organic light-emitting display apparatus and a liquid crystal display apparatus may include a thin film transistor (TFT) that may be used for a pixel switch or a driving circuit. Laser annealing using a laser beam may be performed as a part of a method of manufacturing the TFT at a low temperature processor.

SUMMARY

Embodiments may be realized by providing a semiconductor device, including a buffer layer that is on a substrate and includes an inclined surface; a crystalline silicon layer on the buffer layer; a gate electrode that is on the crystalline silicon layer and insulated from the crystalline silicon layer; and a source electrode and a drain electrode that are each electrically connected to the crystalline silicon layer, an angle between the substrate and the inclined surface being in a range of about 17.5 degrees to less than about 70 degrees.

A slope of an upper surface of the crystalline silicon layer that overlaps with the inclined surface in a plan view may be smaller than a slope of the inclined surface.

The upper surface of the crystalline silicon may be substantially planar.

The buffer layer may include a first buffer layer on the substrate, and a second buffer layer on the first buffer layer. An upper surface of the first buffer layer may be planar and an upper surface of the second buffer layer may have the inclined surface.

The first buffer layer may include silicon nitride (SiNx) and the second buffer layer may include silicon oxide (SiOx).

The buffer layer may include a planar portion, and the inclined surface may include a first inclined surface and a second inclined surface that each extend outward from the planar portion.

Embodiments may be realized by providing a method of manufacturing a semiconductor, the method including forming a buffer layer on a substrate; forming an inclined surface by etching the buffer layer; forming an amorphous silicon layer on the buffer layer; and forming a crystalline silicon layer by crystallizing the amorphous silicon layer using a laser beam, at least some of the laser beam being irradiated from a laser source, completely reflected by the inclined surface, and then absorbed by the amorphous silicon layer.

An angle θ between the substrate and the inclined surface may be in a range of $\sin^{-1}(n_2/n_1)$ to about 70 degrees where $n_1$ is a refractive index of the amorphous silicon layer, and $n_2$ is a refractive index of the buffer layer.

A slope of an upper surface of the amorphous silicon layer that overlaps with the inclined surface in a plan view may be smaller than a slope of the inclined surface.

The buffer layer may include a planar portion, and the inclined surface may include a first inclined surface and a second inclined surface that each extend outward from the planar portion.

The buffer layer may include a first buffer layer on the substrate, and a second buffer layer on the first buffer layer. An upper surface of the first buffer layer may be planar and an upper surface of the second buffer layer may include the inclined surface.

The laser source may be an excimer laser or a frequency doubled Q-switched Nd:YAG laser.

The method may further include, after forming the crystalline silicon layer, forming a gate electrode insulated from the crystalline silicon layer, and forming a source electrode and a drain electrode that are each electrically connected to the crystalline silicon layer.

Embodiments may be realized by providing a display apparatus, including a buffer layer that is on a substrate and includes an inclined surface in an upper surface thereof; a crystalline silicon layer on the buffer layer; a gate electrode on the crystalline silicon layer and insulated from the crystalline silicon layer; a source electrode and a drain electrode that are each electrically connected to the crystalline silicon layer; a pixel electrode that is electrically connected to one of the source electrode and the drain electrode; an intermediate layer that is on the pixel electrode and includes an organic light-emitting layer; and an opposite electrode on the intermediate layer, an angle θ between the substrate and the inclined surface being in a range of about 17.5 degrees to less than about 70 degrees.

A slope of the upper surface of the crystalline silicon layer that overlaps with the inclined surface in a plan view may besmaller than a slope of the inclined surface.

The upper surface of the crystalline silicon layer may be substantially planar.

The buffer layer may include a first buffer layer on the substrate, and a second buffer layer on the first buffer layer. An upper surface of the first buffer layer may be planar and an upper surface of the second buffer layer may include the inclined surface.

The first buffer layer may include silicon nitride (SiNx), and the second buffer layer may include silicon oxide (SiOx).

The buffer layer may include a planar portion, and the inclined surface may include a first inclined surface and a second inclined surface that each extend outward from the planar portion.

The inclined surface may only be in an area corresponding to the crystalline silicon layer.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
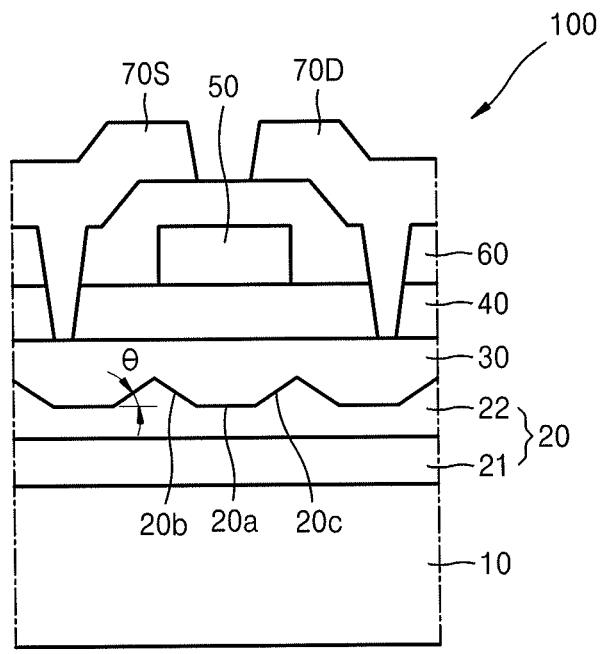
FIG. 1 illustrates a schematic cross-sectional view of a semiconductor device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Expressions such as "at least one of" when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

FIG. 1 illustrates a schematic cross-sectional view of a semiconductor device according to an embodiment. Referring to FIG. 1, according to an embodiment, a semiconductor device 100 may include a buffer layer 20 that is disposed on a substrate 10 and has inclined surfaces 20b and 20c at the upper surface thereof; a crystalline silicon layer 30 that is disposed on the buffer layer 20; a gate electrode 50 that is disposed on the crystalline silicon layer 30 and insulated from the crystalline silicon layer 30; and a source electrode 70S and a drain electrode 70D that are each electrically connected to the crystalline silicon layer 30.

The substrate 10 may be a transparent glass substrate or a plastic substrate. The buffer layer 20 may be disposed on the substrate 10, and according to an embodiment, the buffer layer 20 may include a first buffer layer 21 disposed on the substrate 10, and a second buffer layer 22 disposed on the first buffer layer 21.

The first buffer layer 21 and the second buffer layer 22 may be, for example, silicon nitride (SiNx) and silicon oxide (SiOx), respectively. The buffer layer 20 may be formed as a single layer, or as three or more layers. The first buffer layer 21 and the second buffer layer 22 may be formed not only of silicon nitride and silicon oxide, but of other inorganic materials or organic materials, and the second buffer layer 22 may include, for example, a material with a low refractive index.

The upper surface of the first buffer layer 21 may be planar, and the upper surface of the second buffer layer 22 may include a planar portion 20a and inclined surfaces 20b and 20c. The inclined surfaces 20b and 20c may include a first inclined surface 20b and a second inclined surface 20c that each extend outward from the planar portion 20a.

The inclined surfaces 20b and 20c are inclined at a predetermined angle θ to the substrate 10, and each angle θ between the substrate 10 and the inclined surfaces 20b and 20c may be in a range of about 17.5 to less than about 70 degrees.

Each angle θ between the substrate 10 and the inclined surfaces 20b and 20c in the buffer layer 20 may be greater than a critical angle, which is an angle required for complete, e.g., total, reflection, i.e., an incident laser beam is completely, e.g., totally, reflected, and crystallization efficiency may be increased in a crystallizing process that crystallizes an amorphous silicon layer 30' (see FIG. 2c) to form crystalline silicon. The critical angle is determined by a refractive index of the amorphous silicon layer 30' (see FIG. 2c) and the buffer layer 20, and will be described later in detail.

The crystalline silicon layer 30 is disposed on the buffer layer 20. The crystalline silicon layer 30 may be formed by the crystallization and patterning of the amorphous silicon layer 30' (see FIG. 2c), and the slope of the upper surface of the crystalline silicon layer 30, which overlaps with the inclined surfaces 20b and 20c in the buffer layer 20 in a plan view, is smaller than that of the inclined surfaces 20b and 20c. By forming this structure, the amount of the laser beam reflected on the upper surface of the amorphous silicon layer 30' (see FIG. 2c) may be reduced, and the amount of the laser beam lost to the outside may be reduced.

The upper surface of the crystalline silicon layer 30 according to an embodiment may be, for example, planar. In an embodiment, the crystalline silicon layer 30 may not be planar.

The gate electrode 50, the source electrode 70S, and the drain electrode 70D may be disposed on the crystalline silicon layer 30; a gate insulating layer 40 may be interposed between the crystalline silicon layer 30 and the gate electrode 50; and an interlayer insulating layer 60 may be interposed between the gate electrode 50 and the source electrode 70S and between the gate electrode 50 and the drain electrode 70D.

The gate electrode 50 may include one or more metals selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) and may be formed, for example, as a three-layer structure of Ti/Al/Ti or Mo/Al/Mo.

The source electrode 70S and the drain electrode 70D each may be electrically connected to a source area and a drain area in the crystalline silicon layer 30 via a contact hole formed in the interlayer insulating layer 60 and the gate insulating layer 40. The source electrode 70S and the drain electrode 70D may include one or more metals selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) in the same manner as the gate electrode 50, and be formed as a three-layer structure of Ti/Al/Ti or Mo/Al/Mo.

Figure 2A:
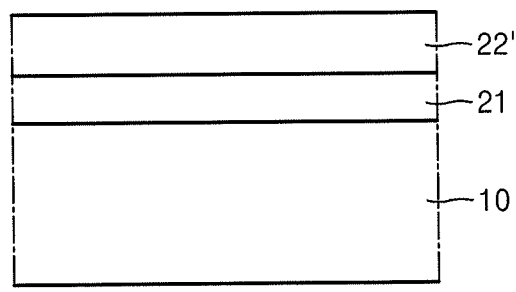
FIGS. 2A to 2F illustrate sequential views of the manufacturing process of the semiconductor device of FIG. 1.

FIGS. 2A to 2F illustrate sequential views of the manufacturing process of the semiconductor device of FIG. 1. Referring to FIG. 2A, the first buffer layer 21 is formed on the substrate 10, and a second unpatterned buffer layer 22' is formed on the first buffer layer 21. For example, the substrate 10 may be formed of transparent glass or plastic; the first buffer layer 21 may be formed of silicon nitride (SiNx); and the second unpatterned buffer layer 22' may be formed of silicon oxide (SiOx).

The first buffer layer 21 and the second unpatterned buffer layer 22' may be deposited by various deposition methods such as a plasma enhanced chemical vapor deposition (PECVD) method, an atmospheric pressure CVD (APCVD) method, and a low pressure CVD (LPCVD) method.

Figure 2B:
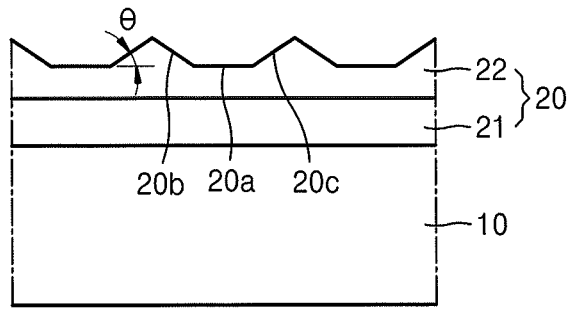

Referring to FIG. 2B, the second buffer layer 22 including the inclined surfaces 20b and 20c may be formed by etching the second unpatterned buffer layer 22'. The second buffer layer 22 may include the planar portion 20a, and the first inclined surface 20b and the second inclined surface 20c, which each extend outward from the planar portion 20a.

The inclined surfaces 20b and 20c are formed to extend outward at a predetermined angle from the substrate 10, and the angle θ between the substrate 10 and each of the inclined surfaces 20b and 20c may be in a range of about 17.5 degrees and less than about 70 degrees.

Figure 2C:
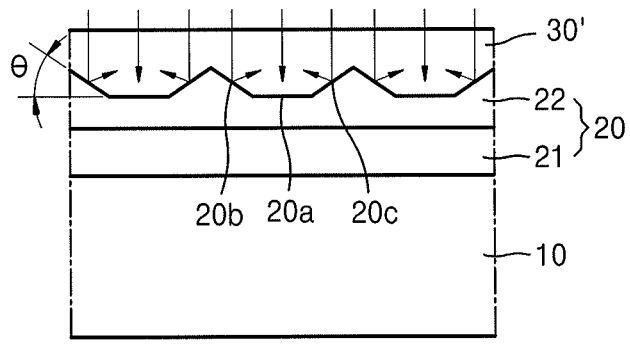
Figure 2D:
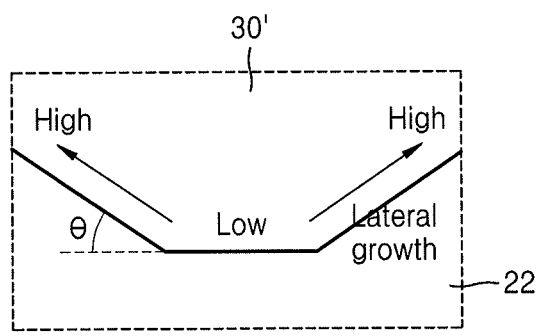

Referring to FIGS. 2C and 2D, after the amorphous silicon layer 30' is formed on the buffer layer 20, the amorphous silicon layer 30' may be crystallized by irradiating the same with a laser beam. A laser source used herein may be an excimer laser having a wavelength of about 308 nm or a frequency doubled Q-switched Nd:YAG laser having a wavelength of about 532 nm.

The temperature of the amorphous silicon layer 30' may be elevated by absorbing the laser beam irradiated from the laser source, and as the temperature drops, the crystallization of the amorphous silicon layer 30' begins. However, the amorphous silicon layer 30' may only absorb less than 50% of incident laser beam, and the absorptance rate of the laser beam may further decrease during crystallizing the amorphous silicon layer 30' using a Nd:YAG laser.

The buffer layer 20 in the semiconductor device 100 according to an embodiment may include the inclined surfaces 20b and 20c at the upper surface thereof, the laser beam transmitted through the amorphous silicon layer 30' may be totally reflected by the inclined surfaces 20b and 20c, the amorphous silicon layer 30' may be irradiated again, and the absorptance rate of the laser beam may be increased.

For the laser beam to be totally reflected by the inclined surfaces 20b and 20c, each angle θ between the substrate 10 and the inclined surfaces 20b and 20c may be greater than a critical angle $i_c$. A refractive index of the amorphous silicon layer 30' is $n_1$, a refractive index of the second buffer layer 22, which is a part of buffer layer 20 and contacts with the amorphous silicon layer 30', is $n_2$, and the angle θ may be larger than the critical angle $i_c$, i.e., $\sin^{-1}(n_2/n_1)$, for total reflection. A refractive index $n_1$ of the amorphous silicon layer 30', a refractive index $n_2$ of the second buffer layer 22, and the critical angle $i_c$ calculated therefrom when using the laser beams of 308 nm and 532 nm are shown in Table 1 below.

TABLE 1

| | $n_1$ | $n_2$ | $i_c$ |
|---|---|---|---|
| 308 nm | 3.49 | 1.46 | 24.7 |
| 532 nm | 4.86 | 1.46 | 17.5 |

Referring to Table 1, each angle θ between the substrate 10 and the inclined surfaces 20b and 20c is, for example, 17.5 degrees or more.

Each angle θ between the substrate 10 and the inclined surfaces 20b and 20c may be less than 70 degrees. If the angle θ is greater than 70 degrees, the laser beam may not reach to the boundary between the planar portion 20a and the inclined surfaces 20b and 20c, and the crystallization may not occur. By forming the inclined surfaces 20b and 20c to extend outward from the substrate 10 at the angle θ of less than 70 degrees, the crystallization may evenly occur over the whole area of the amorphous silicon layer 30'.

The slope of the upper surface of the crystalline silicon layer 30, which overlaps with the inclined surfaces 20b and 20c in the buffer layer 20 in a plan view, may be smaller than that of the inclined surfaces 20b and 20c, and by forming this structure, the amount of the laser beam reflected on the upper surface of the amorphous silicon layer 30' may be reduced, and the amount of the laser beam lost to the outside may be reduced.

According to an embodiment, the upper surface of the amorphous silicon layer 30' may be, for example, substantially planar.

Referring to FIG. 2D, the amount of laser beam absorbed by the amorphous silicon layer 30' may vary depending on the total reflection at the inclined surfaces 20b and 20c. In other words, the amount of laser beam absorbed by the area of the amorphous silicon layer 30' corresponding to the inclined surfaces 20b and 20c may be greater than the amount of laser beam absorbed by the area of the amorphous silicon layer 30' corresponding to the planar portion 20a, and the amorphous silicon layer 30' may have an area having a relatively low temperature and an area having a relatively high temperature according to the arrangement of the planar portion 20a and the inclined surfaces 20b and 20c of the second buffer layer 22.

After irradiating the amorphous silicon layer 30' with the laser beam to melt the amorphous silicon layer 30', the crystallization occurs as the amorphous silicon layer 30' cools. The crystallization may begin in the area of the amorphous silicon layer 30' corresponding to the planar portion 20a having a relatively low temperature, and proceed in a horizontal direction and along the inclined surfaces 20b and 20c, which is a lateral growth.

Due to the lateral growth, crystalline silicon having a homogeneous crystal structure may be formed, and a semiconductor device with high performance may be formed.

Figure 2E:
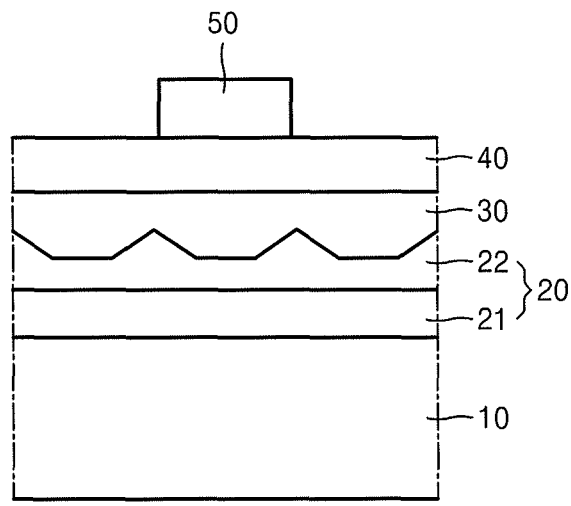
Figure 2F:
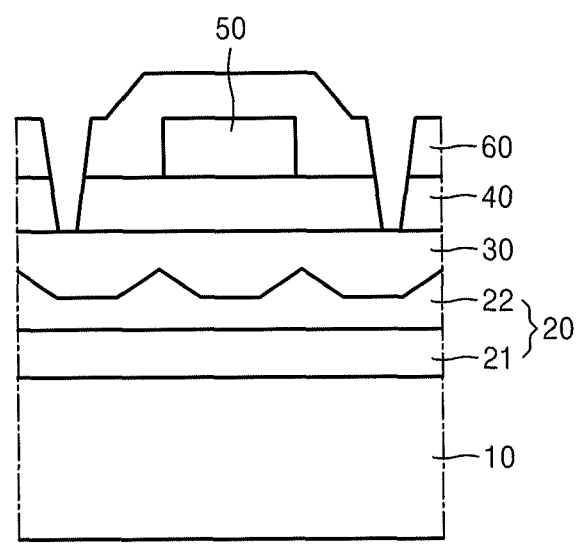

Referring to FIGS. 2E and 2F, after the crystallization and patterning of the amorphous silicon layer 30' (see FIG. 2c) to form the crystalline silicon layer 30, the gate insulating layer 40 that covers the crystalline silicon layer 30 is formed and then the gate electrode 50 is formed on the gate insulating layer 40.

At least one metal selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) may be provided on the gate insulating layer 40, and then the gate electrode 50 may be formed by forming a pattern thereon.

After forming the gate electrode 50, the interlayer insulating layer 60 is formed to cover the gate electrode 50. The gate insulating layer 40 and the interlayer insulating layer 60 may have a single layer or multi-layer structure formed of an inorganic material such as SiOx, SiNx, SiON, $Al_2O_3$, $TiO_2$, $Ta_2O_5$, $HfO_2$, $ZrO_2$, BST, and PZT.

After forming the interlayer insulating layer 60, the contact hole may be formed in the interlayer insulating layer 60 and the gate insulating layer 40. At least one metal selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) are provided on the interlayer insulating layer 60, and pattern is provided thereon to form the source electrode 70S and the drain electrode 70D of FIG. 1.

Although not illustrated in drawings, the manufacturing method of the semiconductor device 100 according to an embodiment may further include the forming of the source area and the drain area, wherein after forming the gate electrode 50, doping is performed at the both sides of the crystalline silicon layer 30 using the gate electrode 50 as a mask to form the source area and the drain area.

Figure 3:
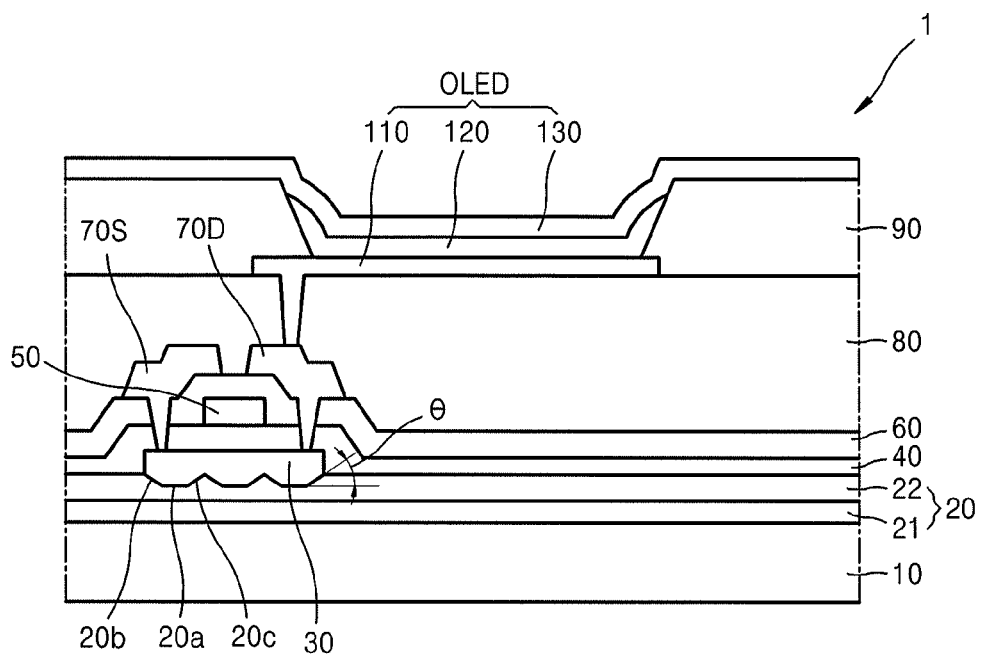
FIG. 3 illustrates a schematic cross-sectional view of a display apparatus according to an embodiment.

FIG. 3 illustrates a schematic cross-sectional view of a display apparatus according to an embodiment. A display apparatus 1 is disposed on the substrate 10, and may include the buffer layer 20 that includes the inclined surfaces 20b and 20c at the upper surface thereof; the crystalline silicon layer 30 disposed on the buffer layer 20; the gate electrode 50 disposed on but insulated from the crystalline silicon layer 30; the source electrode 70S and the drain electrode 70D that are each electrically connected to the crystalline silicon layer 30; a pixel electrode 110 electrically connected to one of the source electrode 70S and the drain electrode 70D; an intermediate layer 120 that is disposed on the pixel electrode 110 and includes an organic light-emitting layer; and an opposite electrode 130 disposed on the intermediate layer 120.

The substrate 10 may be a transparent glass substrate or a plastic substrate. The buffer layer 20 may be disposed on the substrate 10, and the buffer layer 20 according to an embodiment may include the first buffer layer 21 disposed on the substrate 10, and the second buffer layer 22 disposed on the first buffer layer 21.

The first buffer layer 21 and the second buffer layer 22 may be, for example, silicon nitride (SiNx) and silicon oxide (SiOx), respectively. The buffer layer 20 may be formed as a single layer, or as three or more layers. The first buffer layer 21 and the second buffer layer 22 may be formed not only of silicon nitride and silicon oxide, but of other inorganic materials or organic materials, and the second buffer layer 22 may include, for example, a material with a low refractive index.

The upper surface of the first buffer layer 21 may be planar, and the upper surface of the second buffer layer 22 may include the planar portion 20a and the inclined surfaces 20b and 20c. The inclined surfaces 20b and 20c may include the first inclined surface 20b and the second inclined surface 20c that each extend outward from the planar portion 20a.

The inclined surfaces 20b and 20c are inclined at a predetermined angle θ to the substrate 10, and each angle θ between the substrate 10 and the inclined surfaces 20b and 20c may be in a range of about 17.5 to less than about 70 degrees.

The inclined surfaces 20b and 20c in the buffer layer 20 are formed to totally reflect the incident laser beam, which may help increase the crystallization efficiency when crystallizing the amorphous silicon layer 30' (see FIG. 2c) into crystalline silicon. Each angle θ between the substrate 10 and the inclined surfaces 20b and 20c may be larger than the critical angle for the total reflection, i.e., 17.5 degrees, while each angle θ between the substrate 10 and the inclined surfaces 20b and 20c may be less than 70 degrees, and the amorphous silicon layer 30' may be crystallized evenly including the boundary area between the planar portion 20a and the inclined surfaces 20b and 20c.

The crystalline silicon layer 30 is disposed on the buffer layer 20. The crystalline silicon layer 30 may be formed by the crystallization and patterning of the amorphous silicon layer 30' (see FIG. 2c), and the slope of the upper surface of the crystalline silicon layer 30, which overlaps with the inclined surfaces 20b and 20c in the buffer layer 20 in a plan view, is smaller than that of the inclined surfaces 20b and 20c. By forming this structure, the amount of laser beam reflected on the upper surface of the amorphous silicon layer 30' (see FIG. 2c) may be reduced.

The upper surface of the crystalline silicon layer 30 according to an embodiment may be, for example, planar. In an embodiment, the upper surface of the crystalline silicon layer 30 may not be planar.

The inclined surfaces 20b and 20c may be only formed in the area of the buffer layer 20 corresponding to the crystalline silicon layer 30, and another area of the display apparatus 1 may not have inclined surfaces, e.g., any inclined surfaces. The inclined surfaces 20b and 20c are formed to facilitate the crystallizing of the amorphous silicon layer 30' (see FIG. 2c) in an effective manner, and may be only formed in the area of the buffer layer 20 corresponding to the crystalline silicon layer 30 by etching and no pattern may be formed in the other area of the buffer layer 20.

The gate electrode 50, the source electrode 70S and the drain electrode 70D may be disposed on the crystalline silicon layer 30; the gate insulating layer 40 may be interposed between the crystalline silicon layer 30 and the gate electrode 50; and the interlayer insulating layer 60 may be interposed between the gate electrode 50, and the source electrode 70S and between the gate electrode 50 and the drain electrode 70D.

The source electrode 70S and the drain electrode 70D each may be electrically connected to the source area and the drain area in the crystalline silicon layer 30 via the contact hole formed in the interlayer insulating layer 60 and the gate insulating layer 40.

A planarization layer 80 that covers the source electrode 70S and the drain electrode 70D may be disposed on the interlayer insulating layer 60, and an organic light-emitting device (OLED) including the pixel electrode 110, the intermediate layer 120 including the organic light-emitting layer, and the opposite electrode 130 may disposed on the planarization layer 80.

A pixel defining layer 90 that defines a pixel area may disposed at the both sides of the pixel electrode 110. The planarization layer 80 may include a via hole, and through the via hole, the pixel electrode 110 may be electrically connected to one of the source electrode 70S and the drain electrode 70D.

The pixel electrode 110 may be a reflective electrode including a reflective layer. For example, the reflective layer may include at least one selected from silver (Ag), magnesium (Mg), aluminum (Al), platinum (Pt), palladium (Pd), gold (Au), nickel (Ni), neodymium (Nd), iridium (Ir) and chromium (Cr), and on the reflective layer, a transparent or semitransparent electrode layer formed of at least one selected from indium tin oxide (ITO), indium zinc oxide (IZO), zinc oxide (ZnO), indium oxide ($In_2O_3$), indium gallium oxide (IGO), and aluminum zinc oxide (AZO) may be further disposed For example, the pixel electrode 110 may be formed as a three-layer structure of ITO/Ag/ITO.

The intermediate layer 120 may include, for example, at least one of a hole injection layer (HIL), a hole transport layer (HTL), an electron transport layer (ETL) and an electron injection layer (EIL) as well as an organic light-emitting layer. The intermediate layer 120 may further include various function layers.

The opposite electrode 130 may be a transparent or semitransparent electrode formed as a thin film having a thickness of a few to dozens of nm, and at least one material selected from silver (Ag), aluminum (Al), magnesium (Mg), lithium (Li), calcium (Ca), copper (Cu), LiF/Ca, LiF/Al, MgAg and CaAg.

According to an embodiment illustrated in FIG. 3, the display apparatus 1 is, for example, a top-emitting type OLED having the pixel electrode 110 as the reflective electrode, and the opposite electrode 130 as the transparent or semitransparent electrode. In other words, a display apparatus according to another embodiment of may be a bottom-emitting type OLED having a pixel electrode as a transparent or semi-transparent electrode, and an opposite electrode as a reflective electrode.

Figure 4:
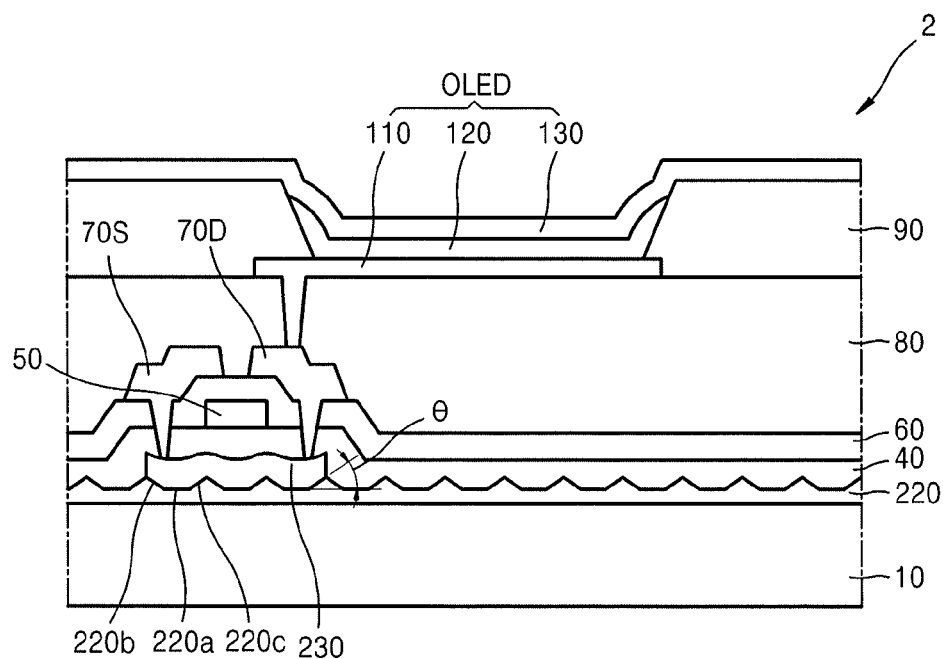
FIG. 4 illustrates a schematic cross-sectional view of a display apparatus according to another embodiment.

FIG. 4 illustrates a schematic cross-sectional view of a display apparatus according to another embodiment. A display apparatus 2 illustrated in FIG. 4 has the same structure as the display apparatus 1 of an embodiment illustrated in FIG. 3 except for a buffer layer 220 and a crystalline silicon layer 230.

The buffer layer 220 included in the display apparatus 2 of FIG. 4 may be formed as a single layer. The upper surface of the buffer layer 220 may include a planar portion 220a, and the inclined surfaces 220b and 220c. The first inclined surface 220b and second inclined surface 220c included in the upper surface of the buffer layer 220 may each extend outward from the planar portion 220a. Each angle between the substrate 10 and the inclined surfaces 220b and 220c in the buffer layer 220 may be in a range of about 17.5 degrees to 70 degrees.

The inclined surfaces 220b and 220c in the buffer layer 220 may be formed on the whole surface of the display apparatus 2. A crystalline silicon layer 230 may be formed by the process of the crystallization and patterning of the amorphous silicon layer, wherein in the process, the inclined surfaces 220b and 220c of the buffer layer 20 that are formed on the whole surface of the display apparatus 2 may facilitate the crystallizing of the amorphous silicon layer in an effective manner.

The crystalline silicon layer 30 may be formed on the buffer layer 220, and the slope of the upper surface of the crystalline silicon layer 30, which overlaps with the inclined surfaces 220b and 220c in the buffer layer 220 in a plan view, may be smaller than that of the inclined surfaces.

Figure 5:
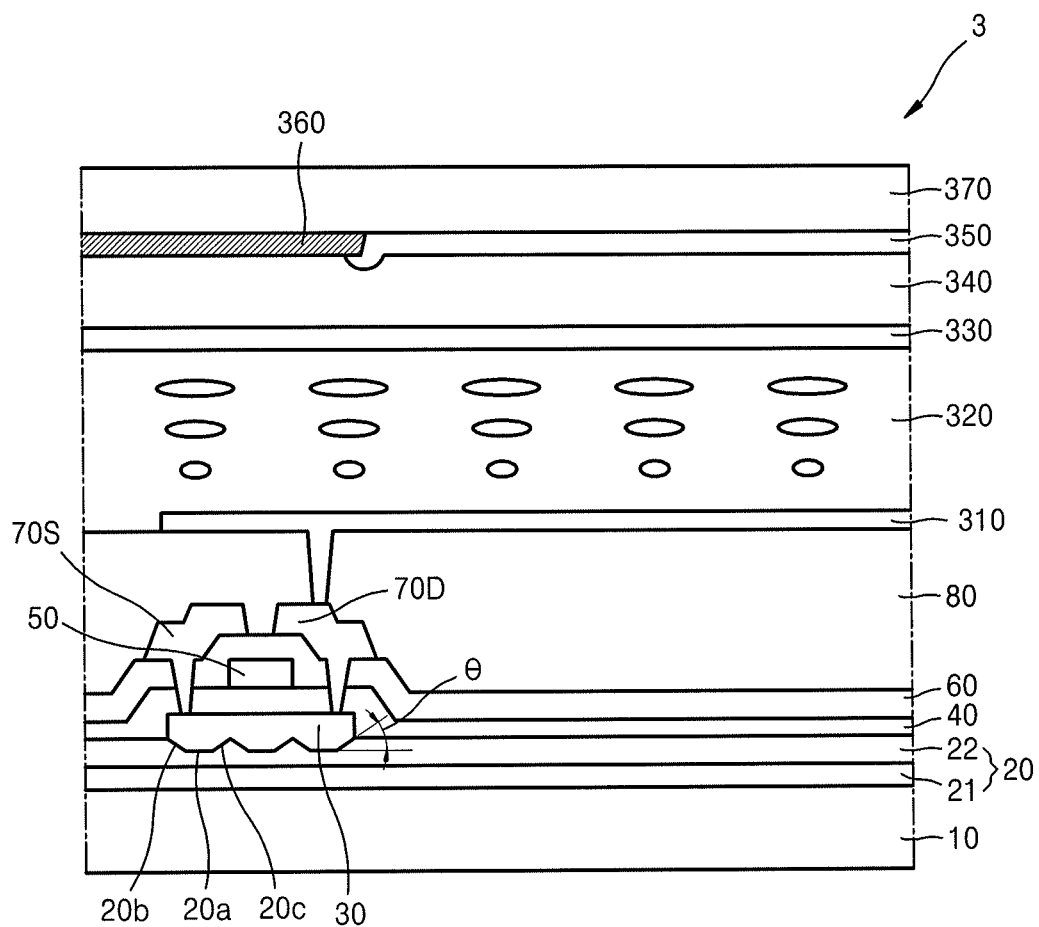
FIG. 5 illustrates a schematic cross-sectional view of a display apparatus according to another embodiment.

FIG. 5 illustrates a schematic cross-sectional view of a display apparatus according to another embodiment. A liquid crystal layer 320 may be disposed between the substrate 10 and an upper substrate 370. The liquid crystal layer 320 may be disposed between a first pixel electrode 310 and the second pixel electrode 330, and may block or transmit light emitted from a back light (not shown) by adjusting an orientation of the liquid crystal depending on the voltage applied to the first pixel electrode 310 an the second pixel electrode 330.

The first pixel electrode 310 may be disposed on the planarization layer 80. The first pixel electrode 310 may be electrically connected to the drain electrode 70D through the via hole of the planarization layer 80, and may include a transparent conductive material.

The upper substrate 370 may be, for example, a transparent glass substrate or a plastic substrate, similar to the substrate 10. The upper substrate 370 may have a color filter 350, a black matrix 360, an overcoat layer 340 and the second pixel electrode 330.

The color filter 350 may be formed of, for example, a photo-organic material, and may impart a color to the light that is emitted from the back light and passes through the liquid crystal layer 320. The black matrix 360 may prevent the light that passes through the color filter 350 from being mixed and interrupted.

The overcoat layer 340 may be disposed on the color filter 350 and the black matrix 360, and may protect the color filter 350. The overcoat layer 340 may include material such as acrylic-based epoxy.

The second pixel electrode 330 may be disposed on the overcoat layer 340 and include a transparent conductive material. The second pixel electrode 330 may directly apply a voltage to the liquid crystal layer 320 along with the first pixel electrode 310.

By way of summation and review, in laser annealing using a laser beam, the laser beam may be emitted onto an amorphous semiconductor layer, which may be formed as a film on a substrate, to locally heat the semiconductor layer, and then the semiconductor layer may be crystallized as the semiconductor layer cools. The mobility of a carrier may be increased in the crystallized semiconductor layer, and the thin film transistor may show high performance.

As described above, according to the one or more of the above embodiments, the semiconductor device, the manufacturing method thereof and the display apparatus may increase a crystallization efficiency of a laser beam during a laser annealing, and may induce a lateral growth of a grain.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a buffer layer that is on a substrate and includes an inclined surface;
   a crystalline silicon layer on the buffer layer;
   a gate electrode that is on the crystalline silicon layer and insulated from the crystalline silicon layer; and
   a source electrode and a drain electrode that are each electrically connected to the crystalline silicon layer,
   an angle between the substrate and the inclined surface being in a range of about 17.5 degrees to less than about 70 degrees,
   wherein a slope of an upper surface of the crystalline silicon layer that overlaps with the inclined surface in a plan view is smaller than a slope of the inclined surface.

2. The semiconductor device as claimed in claim 1, wherein the upper surface of the crystalline silicon is substantially planar.

3. The semiconductor device as claimed in claim 1, wherein the buffer layer includes a first buffer layer on the substrate, and a second buffer layer on the first buffer layer, wherein an upper surface of the first buffer layer is planar and an upper surface of the second buffer layer has the inclined surface.

4. The semiconductor device as claimed in claim 3, wherein the first buffer layer includes silicon nitride (SiNx) and the second buffer layer includes silicon oxide (SiOx).

5. The semiconductor device as claimed in claim 1, wherein the buffer layer includes a planar portion, and the inclined surface includes a first inclined surface and a second inclined surface that each extend outward from the planar portion.

6. A method of manufacturing a semiconductor, the method comprising:
   forming a buffer layer on a substrate;
   forming an inclined surface by etching the buffer layer;
   forming an amorphous silicon layer on the buffer layer; and
   forming a crystalline silicon layer by crystallizing the amorphous silicon layer using a laser beam,
   at least some of the laser beam being irradiated from a laser source, completely reflected by the inclined surface, and then absorbed by the amorphous silicon layer,
   wherein a slope of an upper surface of the amorphous silicon layer that overlaps with the inclined surface in a plan view is smaller than a slope of the inclined surface.

7. The method as claimed in claim 6, wherein an angle $\theta$ between the substrate and the inclined surface is in a range of $\sin^{-1}(n_2/n_1)$ to about 70 degrees where $n_1$ is a refractive index of the amorphous silicon layer, and $n_2$ is a refractive index of the buffer layer.

8. The method as claimed in claim 6, wherein the buffer layer includes a planar portion, and the inclined surface includes a first inclined surface and a second inclined surface that each extend outward from the planar portion.

9. The method as claimed in claim 6, wherein the buffer layer includes a first buffer layer on the substrate, and a second buffer layer on the first buffer layer, wherein an upper surface of the first buffer layer is planar and an upper surface of the second buffer layer includes the inclined surface.

10. The method as claimed in claim 6, wherein the laser source is an excimer laser or a frequency doubled Q-switched Nd:YAG laser.

11. The method as claimed in claim 6, further comprising, after forming the crystalline silicon layer, forming a gate electrode insulated from the crystalline silicon layer, and forming a source electrode and a drain electrode that are each electrically connected to the crystalline silicon layer.

12. A display apparatus, comprising:
   a buffer layer that is on a substrate and includes an inclined surface in an upper surface thereof;
   a crystalline silicon layer on the buffer layer;
   a gate electrode on the crystalline silicon layer and insulated from the crystalline silicon layer;
   a source electrode and a drain electrode that are each electrically connected to the crystalline silicon layer;
   a pixel electrode that is electrically connected to one of the source electrode and the drain electrode;
   an intermediate layer that is on the pixel electrode and includes an organic light-emitting layer; and
   an opposite electrode on the intermediate layer,
   an angle $\theta$ between the substrate and the inclined surface being in a range of about 17.5 degrees to less than about 70 degrees,
   wherein a slope of the upper surface of the crystalline silicon layer that overlaps with the inclined surface in a plan view is smaller than a slope of the inclined surface.

13. The display apparatus as claimed in claim 12, wherein the upper surface of the crystalline silicon layer is substantially planar.

14. The display apparatus as claimed in claim 12, wherein the buffer layer includes a first buffer layer on the substrate, and a second buffer layer on the first buffer layer, wherein an upper surface of the first buffer layer is planar and an upper surface of the second buffer layer includes the inclined surface.

15. The display apparatus as claimed in claim 14, wherein the first buffer layer includes silicon nitride (SiNx), and the second buffer layer includes silicon oxide (SiOx).

16. The display apparatus as claimed in claim 12, wherein the buffer layer includes a planar portion, and the inclined surface includes a first inclined surface and a second inclined surface that each extend outward from the planar portion.

17. The display apparatus as claimed in claim 12, wherein the inclined surface is only in an area corresponding to the crystalline silicon layer.

* * * * *